(12) United States Patent
Xie

(10) Patent No.: US 10,490,758 B2
(45) Date of Patent: Nov. 26, 2019

(54) FLEXIBLE OLED DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Wuhan, Hubei (CN)

(72) Inventor: Rui Xie, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 15/740,290

(22) PCT Filed: Nov. 24, 2017

(86) PCT No.: PCT/CN2017/112893
§ 371 (c)(1),
(2) Date: Dec. 27, 2017

(87) PCT Pub. No.: WO2019/085094
PCT Pub. Date: May 9, 2019

(65) Prior Publication Data
US 2019/0131551 A1    May 2, 2019

(30) Foreign Application Priority Data
Oct. 30, 2017 (CN) .......................... 2017 1 1039262

(51) Int. Cl.
*H01L 51/00* (2006.01)
*H01L 51/52* (2006.01)
(Continued)

(52) U.S. Cl.
CPC ...... *H01L 51/0097* (2013.01); *C08G 73/1067* (2013.01); *H01L 27/3262* (2013.01);
(Continued)

(58) Field of Classification Search
CPC ......... H01L 51/0097; H01L 2251/5338; H01L 51/5256
See application file for complete search history.

(56) References Cited

U.S. PATENT DOCUMENTS

| 2003/0034497 A1* | 2/2003 | Yamazaki ........... H01L 27/3244 257/86 |
| 2015/0102326 A1* | 4/2015 | An ...................... H01L 51/5256 257/40 |

(Continued)

FOREIGN PATENT DOCUMENTS

| CN | 103094306 A | 5/2013 |
| CN | 103928490 A | 7/2014 |

*Primary Examiner* — Mohammed R Alam
(74) *Attorney, Agent, or Firm* — Hemisphere Law, PLLC; Zhigang Ma

(57) ABSTRACT

The present invention provides a flexible organic light-emitting diode (OLED) display panel, which includes a first polyimide layer, a barrier layer and a second polyimide layer that are sequentially stacked and a thin film transistor (TFT) structure and an OLED structure that are sequentially disposed on the second polyimide layer, in which a material of the barrier layer includes at least one of silicon dioxide and silicon nitride. By arranging a flexible base as an upper polyimide layer and a lower polyimide layer and adding a barrier layer between the two polyimide layers, the present invention can effectively block water and oxygen from entering an interior of a component through a flexible polyimide base, thereby protecting the TFT structure and the OLED structure and improving the lifespan of the OLED display panel. The present invention further provides a manufacturing method of a flexible OLED display panel.

7 Claims, 6 Drawing Sheets

(51) Int. Cl.
*C08G 73/10* (2006.01)
*H01L 27/32* (2006.01)
*H01L 51/56* (2006.01)

(52) U.S. Cl.
CPC .......... *H01L 51/5253* (2013.01); *H01L 51/56* (2013.01); *H01L 2251/5338* (2013.01)

(56) References Cited

U.S. PATENT DOCUMENTS

| | | |
|---|---|---|
| 2016/0301029 A1 | 10/2016 | Lee |
| 2019/0035869 A1* | 1/2019 | Kim .................... H01L 27/3262 |
| 2019/0036050 A1* | 1/2019 | Kim .................... H01L 51/0097 |

* cited by examiner

FLEXIBLE OLED DISPLAY PANEL AND MANUFACTURING METHOD THEREOF

RELATED APPLICATIONS

The present application is a National Phase of International Application Number PCT/CN2017/112893, filed Nov. 24, 2017, and claims the priority of China Application No. 201711039262.9, filed Oct. 30, 2017.

FIELD OF THE DISCLOSURE

The present invention relates to the field of display panel technology, and more particularly to a flexible organic light-emitting diode (OLED) display panel and a manufacturing method thereof.

BACKGROUND

With the development of the display technology, people increasingly demand higher and higher quality of color and lightness, flexible organic light-emitting diode (OLED) displays are now gradually entering into consumer electronics markets of mobile devices, televisions, etc. As a flexible display, a polyimide layer manufactured mainly from polyimide (PI) is a flexible substrate of thin film transistor (TFT) structures and OLED structures. However, the polyimide layer has poor ability of blocking oxygen ($O_2$) and water ($H_2O$), which would result in an amount of water or oxygen penetrating through the polyimide layer into circuits of the TFT structure and thus affect the lifespan of the OLED luminescent material.

Thus, it is desired to provide a flexible OLED display panel, which can well block water and oxygen from entering into the TFT structure through the flexible base and can prolong the lifespan of the OLED luminescent material.

SUMMARY

On this account, the present invention provides a flexible organic light-emitting diode (OLED) display panel, which can effectively block water and oxygen from penetrating through a flexible polyimide base for protecting thin film transistor (TFT) structures and OLED structures and improving the luminescent lifespan of the OLED display panel.

First, the present invention provides a flexible OLED display panel, which includes sequentially stacked first polyimide layer, barrier layer, second polyimide layer, and a TFT structure and an OLED structure which are sequentially disposed on the second polyimide layer, and a material of the barrier layer that includes at least one of silicon dioxide and silicon nitride.

In one embodiment, the barrier layer includes a single-layered silicon dioxide layer or a single-layered silicon nitride layer, or alternately stacked silicon dioxide layers and silicon nitride layers.

In one embodiment, a thickness of the barrier layer is 0.1-2.0 μm.

In one embodiment, an oxygen barrier layer is further disposed between the second polyimide layer and the TFT structure, and a material the oxygen barrier layer includes at least one of silicon dioxide and silicon nitride. A thickness of the oxygen barrier layer is 0.1-1.5 μm.

In one embodiment, an organic film is further disposed between the TFT structure and the OLED structure, and the organic film simultaneously covers a side edge of the TFT structure that is near a terminal of a non-display panel and partially covers the second polyimide layer, and a material of the organic film includes one or more of polyethylene, polypropylene, polystyrene, polylactic acid, polyethylene terephthalate, polyimide and polyester. A thickness of the organic film is 0.5-20 μm.

In one embodiment, a material of each of the first polyimide layer and the second polyimide layer is polyimide resin or modified polyimide resin.

In one embodiment, a thickness of each of the first polyimide layer and the second polyimide layer is 3-20 μm.

According to a first aspect, an embodiment of the present invention provides a flexible OLED display panel, which can effectively block water and oxygen from entering an interior of a component through a flexible polyimide base by arranging a flexible base as an upper polyimide layer and a lower polyimide layer and adding a barrier layer between the two polyimide layers, thereby protecting the TFT structure and the OLED structure and improving the lifespan of the OLED display panel.

Second, the present invention provides a manufacturing method of a flexible OLED display panel, which includes the following steps:

providing a rigid substrate;

sequentially manufacturing a first polyimide layer, a barrier layer, a second polyimide layer, a TFT structure and an OLED structure on the rigid substrate; wherein a the barrier layer includes at least one of silicon dioxide and silicon nitride;

applying a laser lift-off process to separate the rigid substrate and the first polyimide layer, so as to obtain a flexible OLED display panel.

In one embodiment, the barrier layer includes a single-layered silicon dioxide layer or a single-layered silicon nitride layer, or includes alternately stacked silicon dioxide layers and silicon nitride layers, a thickness of the barrier layer is 0.1-2.0 μm.

In one embodiment, a material of the first polyimide layer and the second polyimide layer is polyimide resin or modified polyimide resin. A thickness of each of the first polyimide layer and the second polyimide layer are 3-20 μm.

In one embodiment, the manufacturing method further includes manufacturing an oxygen barrier layer between the second polyimide layer and the TFT structure, and/or manufacturing an organic film between the TFT structure and the OLED structure, wherein a material of the oxygen barrier layer includes at least one of silicon dioxide and silicon nitride, and the organic film simultaneously covers a side edge of the TFT structure that is near to a terminal of a non-display area and partially covers the second polyimide layer, and a material of the organic film includes one or more of polyethylene, polypropylene, polystyrene, polylactic acid, polyethylene terephthalate and polyester.

In one embodiment, the rigid substrate includes a glass substrate, a wafer, a metal thin film or a rigid thin film.

According to a second aspect, an embodiment of the present invention provides a manufacturing method of a flexible OLED display panel, in which a composite flexible base with a first polyimide layer/a barrier layer/a second polyimide layer is obtained and can well block water and oxygen from entering into the TFT structure or the OLED structure and prolong the luminescent lifespan of the OLED display panel, so as to improve the product manufacturing quality.

The following specification partially describes advantages of the present invention, where some of these advantages are apparent according to this specification, or can be learned by practicing the embodiments of the present invention.

DETAILED DESCRIPTION OF PREFERRED EMBODIMENTS

The following description is only the preferred examples of the present invention, and it should be pointed out that, the ordinary person skilled in the art can make various improvements and modifications without departing from the principle of the present invention, and these improvements and modifications should all fall into the protection scope of the present invention.

Figure 1:
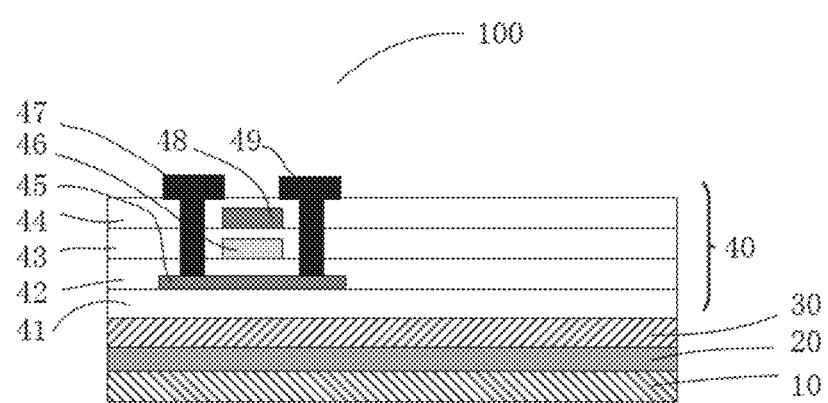
FIG. 1 is a structural schematic diagram of a flexible OLED display panel that includes a single-layered structure of a barrier layer provided by an embodiment of the invention.

As shown in FIG. 1, the present invention provides a flexible OLED display panel 100, which includes a first polyimide layer 10, a barrier layer 20 and a second polyimide layer 30 that are sequentially stacked, and a thin film transistor (TFT) structure 40 and an organic light-emitting diode (OLED) structure (not shown in FIG. 1) that are sequentially disposed on the second polyimide layer 30, and a material of the barrier layer includes at least one of silicon dioxide and silicon nitride.

In one embodiment of the present invention, the barrier layer 20 is disposed between the first polyimide layer 10 and the second polyimide layer 30, and the first polyimide layer 10, the barrier layer 20 and the second polyimide layer 30 tightly adhere together; the barrier layer 20 may be manufactured from a silicon dioxide ($SiO_2$) material, a silicon nitride ($SiN_x$) material or a composite material of $SiO_2$ and $SiN_x$; a thickness of the barrier layer 20 is 0.1-2.0 μm, and particularly, may be 0.2 μm, 0.8 μm, 1 μm or 1.5 μm.

In an embodiment of the present invention, the barrier layer includes a single-layered silicon dioxide layer.

In another embodiment of the present invention, the barrier layer includes a single-layered silicon nitride layer.

Figure 2:
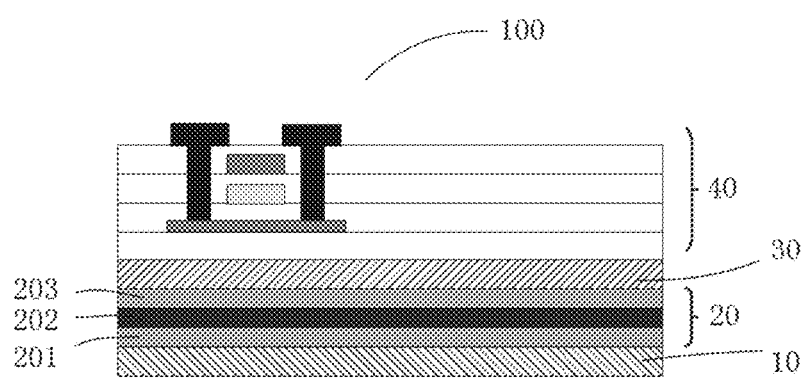
FIG. 2 is a structural schematic diagram of a flexible OLED display panel that includes a multi-layered structure of a barrier layer of a flexible OLED display panel provided by an embodiment of the invention.

In another embodiment of the present invention, the barrier layer includes alternately stacked silicon dioxide layers and silicon nitride layers. The arrangement of the silicon dioxide layers and the silicon nitride layers interior of the barrier layer 20 may be written as A-B-A-B-A-B- . . . , i.e., (AB)n, in which n is an integer greater than or equal to 1, and A represents an silicon dioxide layer, and B represents a silicon nitride layer. The multi-layered structure of the barrier layer 20 may lengthen penetrating paths of water and oxygen and therefore includes more outstanding steam and oxygen blocking ability. As shown in FIG. 2, the barrier layer 20 provided by an embodiment of the invention may further include a first $SiO_2$ layer 201, and a $SiN_x$ layer 202 and a second $SiO_2$ layer 203 that are alternating stacked, and a thickness of the first $SiO_2$ layer 201 is 0.1-2.0 μm, and a thickness of the $SiN_x$ layer 202 is 0.1-2.0 μm, and a thickness of the second $SiO_2$ layer 203 is 0.1-2.0 μm.

In one embodiment of the present invention, in comparison with a single polyimide flexile base or another flexible base made from an organic polymeric material, the composite base structure consisting of the first polyimide layer 10, the barrier layer 20 and the second polyimide layer 30 has the following characteristics: on one hand, the composite base structure consisting of the first polyimide layer 10, the barrier layer 20 and the second polyimide layer 30 has good water and oxygen blocking function and thus greatly reduces the possibility of water and oxygen penetrating through the flexible base, so as to protect the TFT structure and the OLED structure and prolong the lifespan of the OLED display panel; on the other hand, the composite flexible base structure also has good flexibility and thus can be widely applied for manufacturing a flexible panel.

A material of the first polyimide layer 10 and the second polyimide layer 30 provided by an embodiment of the present invention is polyimide resin or modified polyimide resin. A thickness range of the first polyimide layer 10 is 3-20 μm, and a thickness range of the second polyimide layer 30 is 3-20 μm; a thicknesses of the first polyimide layer 10 and the second polyimide layer 30 may be different, and the specific thickness thereof may be selected in accordance with practical component types.

In one embodiment of the present invention, the TFT structure 40 includes a buffer layer 41, a first gate insulating layer (GI1) 42, a second gate insulating layer (GI2) 43 and a dielectric layer 44 that are stacked and functional components distributed therein, in which the functional components include a polysilicon layer 45, a first gate electrode (GE1) 46, a second gate electrode (GE2) 48, a first drain electrode 47 and a second drain electrode 49. In one embodiment, the polysilicon layer 45 is arranged in the interior of the first gate insulating layer 42 and adheres near to the lower surface of the first gate insulating layer 42 and to the buffer layer 41; the first gate electrode 46 is arranged in the second gate insulating layer 43; the second gate electrode 48 is arranged in the dielectric layer 44; the first drain electrode 47 and the second drain electrode 49 penetrate sequentially through the dielectric layer 44 and the second gate insulating layer 43 and connect with the polysilicon layer 45; the first gate electrode 46 and the second gate electrode 48 are arranged between the first drain electrode 47 and the second drain electrode 49. The TFT structure 400 is a normal technical structure, and the present invention does not make particular limitations.

Figure 3:
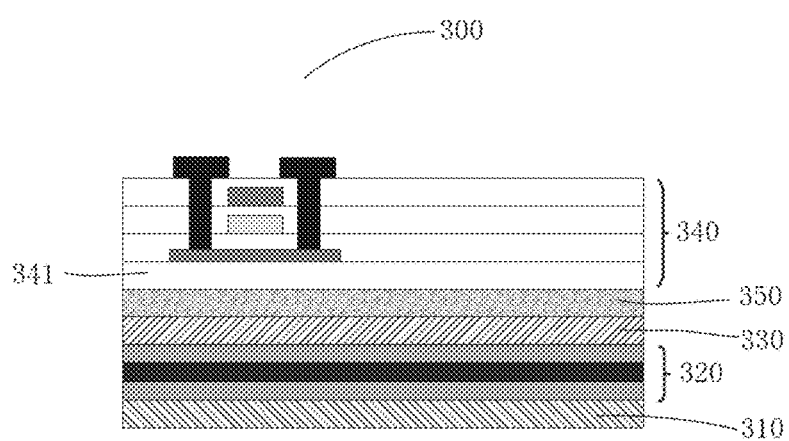
FIG. 3 is a structural schematic diagram of a flexible OLED display panel provided by an embodiment of the invention.

Another embodiment of the present invention provides a flexible OLED display panel 300, which includes, as shown in FIG. 3, a first polyimide layer 310, a barrier layer 320 and a second polyimide layer 330 that are sequentially stacked and an oxygen barrier layer 350, a TFT structure 340 and an OLED structure (not shown in FIG. 3) that are sequentially disposed on the second polyimide layer 330; the oxygen barrier layer 350 is disposed between the second polyimide layer 330 and the TFT structure 340 and adheres together with a buffer layer 341 of the TFT structure 340; a material of the oxygen barrier layer 350 includes at least one of silicon dioxide and silicon nitride. A thickness of the oxygen barrier layer 350 is 0.1-1.5 μm. The oxygen barrier layer 350 can further block water and oxygen that penetrate through the substrate, in order to protect the TFT structure and prolong the luminescent lifetime of the display panel.

Figure 4:
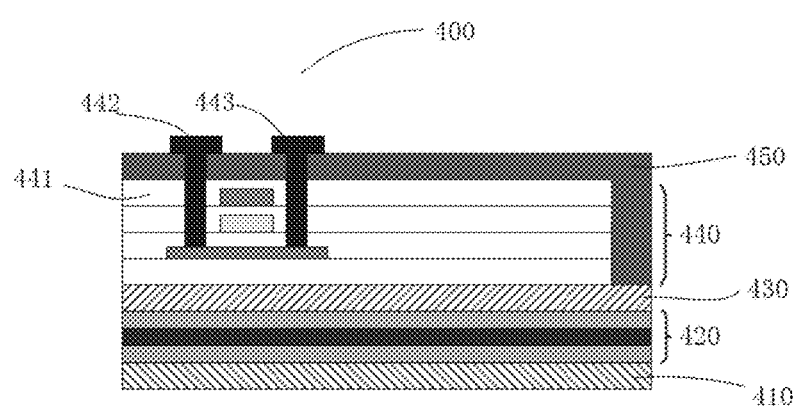
FIG. 4 is a structural schematic diagram of a flexible OLED display panel provided by an embodiment of the invention.

Another embodiment of the present invention provides a flexible OLED display panel 400, which includes, as shown in FIG. 4, a first polyimide layer 410, a barrier layer 420 and a second polyimide layer 430 that are sequentially stacked and a TFT structure 440, an organic film 450 and an OLED structure (not shown in FIG. 4) that are sequentially disposed on the second polyimide layer 430; the organic film 450 is disposed between the TFT structure 440 and the OLED structure, and the organic film 450 simultaneously covers a side edge of the TFT structure 440 that is near a terminal of a non-display area and partially covers the second polyimide layer 430. The organic film 450 is stacked on the dielectric layer 441, and simultaneously the organic film 450 and the TFT structure 440 are all stacked on second polyimide layer 430. In addition, the organic film 450 reserves cavities for the first drain electrode 442 and the second drain electrode 443 to penetrate therethrough; the cavities may closely surround the first drain electrode 442 and the second drain electrode 443. In one embodiment, the first drain electrode 442, the second drain electrode 443 and the dielectric layer 441 are a partial structure of the TFT structure 440, but the invention is not particularly limited herein. A material of the organic film 450 includes one or more of polyethylene, polypropylene, polystyrene, polylactic acid, polyethylene terephthalate, polyimide and polyester; a thickness of the organic film 450 is 0.5-20 μm. The organic film 450 and the second polyimide layer 430 are all organic polymers, and therefore, the organic film 450 and the second polyimide layer 430 can be formed more closely. By adding the organic film 450 on the surface of the TFT structure 440 in a driver display and connecting the organic film 450 on the second polyimide layer 430, the folding display of the OLED display panel can be greatly enhanced, and the folding resistance of the panel can be improved.

Figure 5:
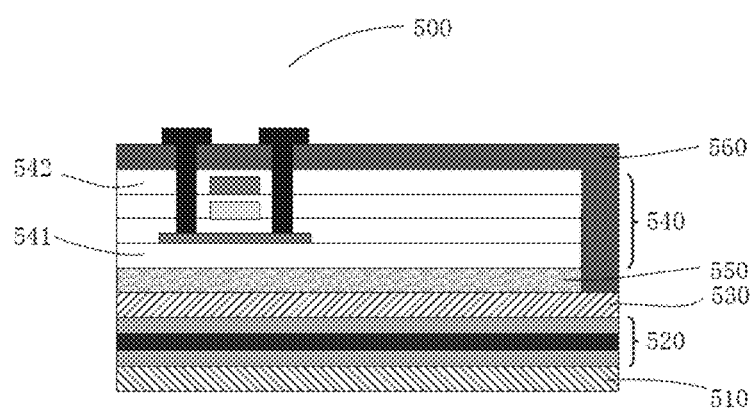
FIG. 5 is a structural schematic diagram of a flexible OLED display panel provided by an embodiment of the invention

Another embodiment of the present invention provides a flexible OLED display panel 500, which includes, as shown in FIG. 5, a first polyimide layer 510, a barrier layer 520 and a second polyimide layer 530 that are sequentially stacked and an oxygen barrier layer 550, a TFT structure 540, an organic film 560 and an OLED structure (not shown in FIG. 5) that are sequentially disposed on second polyimide layer 530. The oxygen barrier layer 550 is disposed between the second polyimide layer 530 and the TFT structure 540 and adheres together with a buffer layer 541 of the TFT structure 540; a material of the oxygen barrier layer 550 includes at least one of silicon dioxide and silicon nitride; a thickness of the oxygen barrier layer 550 is 0.1-1.5 μm. The organic film 560 is disposed between the TFT structure 540 and the OLED structure, and the organic film 560 simultaneously covers a side edge of the TFT structure 540 that is near a terminal of a non-display area and partially covers the second polyimide layer 530; the organic film 560 is stacked on a dielectric layer 542, and simultaneously the organic film 560 and the TFT structure 540 are all stacked on the second polyimide layer 530; a material of the organic film 450 includes one or more of polyethylene, polypropylene, polystyrene, polylactic acid, polyethylene terephthalate, polyimide and polyester; a thickness of the organic film 450 is 0.5-20 μm. The flexible OLED display panel 500 of the embodiment simultaneously includes the oxygen barrier layer 550 and the organic film 560 and not only has superior water and oxygen blocking function and longer luminescent lifespan but also has folding resistance.

Furthermore, an embodiment of the present invention further provides a flexible OLED display panel 300, which further includes an organic film 360; the organic film 360 is stacked between the TFT structure 350 and the OLED structure 370 and extends to the upper surface of the second polyimide layer 330, and the organic film 360 covers a side face of a terminal of the TFT structure 350, and a material of the organic film 360 includes one or more of polyethylene, polypropylene, polystyrene, polylactic acid, polyethylene terephthalate and polyester.

Figure 6:
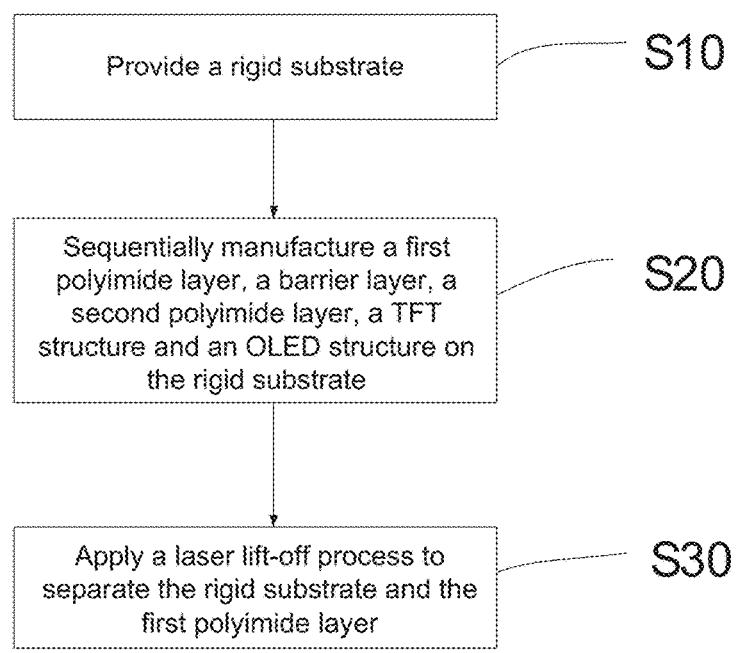
FIG. 6 is a flowchart of a manufacturing process of a flexible OLED display panel provided by an embodiment of the invention.

As shown in FIG. 6, the present invention further provides a manufacturing method of a flexible OLED display panel, which includes the following steps:

S10, providing rigid substrate;

S20, sequentially manufacturing a first polyimide layer, a barrier layer, a second polyimide layer, a TFT structure and an OLED structure on the rigid substrate;

S30, applying a laser lift-off process to separate the rigid substrate and the first polyimide layer, so as to obtain a flexible OLED display panel.

In one embodiment of the present invention, in S10, the rigid substrate may be a glass substrate, a wafer, a metal thin film or a rigid thin film. The rigid substrate is required to have a higher laser transmittance for facilitating the subsequent light lift-off process to be performed smoothly. Certainly, in order to have batter adherence of the rigid substrate and subsequent light-to-heat conversion layer and flexible substrate layer, a surface treatment may be performed on the rigid substrate for improving the surface energy of the rigid substrate. In one embodiment of the present invention, the surface treatment includes: cleaning the surface of the rigid substrate; then using noble gas such as nitrogen and argon to perform a plasma treatment on the cleaned surface of the rigid substrate. By performing the above treatment, the surface energy of the rigid substrate can be improved, and the binding force between the first polyimide layer and the rigid substrate is enhanced, so as to prevent the first polyimide layer and the rigid substrate from stripping or falling during the subsequent processes.

In one embodiment of the present invention, in S20, a material of the first polyimide layer and the second polyimide layer is polyimide resin or modified polyimide resin; a thickness ranges of the first polyimide layer and the second polyimide layer are all 3-20 μm, but specific thicknesses of the first polyimide layer and the second polyimide layer may be different.

Specifically, the step of manufacturing the first polyimide layer on the rigid substrate includes:

respectively forming vapor of monomers from an aromatic tetracarboxylic dianhydride monomer and a diamine monomer and then mixing the vapor of monomers, and depositing the mixed vapor on the rigid substrate; then performing a polyimidization treatment on the dianhydride monomer and the diamine monomer that are deposited on the rigid substrate, so as to obtain a PI layer. In one embodiment, during the evaporation process of the aromatic tetracarboxylic dianhydride monomer and the diamine monomer, the evaporation temperature of the aromatic tetracarboxylic dianhydride monomer is 150-180° C., and the evaporation temperature of the diamine monomer is 60-160° C. The polyimidization treatment may be performed in an infrared stove, and the treatment process adopts heating to 320-385° C. from the room temperature by the rate of 0.5-3° C./min under the protection of nitrogen gas and then keeping 1-3 hours; and then naturally cooling down to the room temperature, so as to obtain the PI layer.

In one embodiment of the present invention, in S20, the barrier layer is arranged between the first polyimide layer and the second polyimide layer, and a material of the barrier layer 20 includes one or two of silicon dioxide and silicon nitride; a thickness of the barrier layer 20 is 0.1-2.0 µm, and particularly, may be 0.2 µm, 0.8 µm, 1 µm or 1.5 µm. The barrier layer may further include silicon dioxide layers and silicon nitride layers that are alternately stacked. The manufacturing step of the barrier layer on the first polyimide layer is: placing a thin film layer that includes one or two of silicon dioxide and silicon nitride on the first polyimide layer by performing a plasma enhanced chemical vapor deposition (PECVD) process or a magnetron sputtering process, or manufacture various types of thin films formed of alternating layers of silicon dioxide and silicon nitride, so as to obtain the barrier layer.

Preferably, S20 further includes manufacturing an oxygen barrier layer between the second polyimide layer and the OLED structure and/or manufacturing an organic film between the TFT structure and the OLED structure; a material of the oxygen barrier layer includes at least one of silicon dioxide and silicon nitride, the organic film simultaneously covers a side edge of the TFT structure that is near to a terminal of the non-display area and partially covers the second polyimide layer, and a material of the organic film includes one or more of polyethylene, polypropylene, polystyrene, polylactic acid, polyethylene terephthalate and polyester.

In one embodiment of the present invention, in S20, the manufacturing methods of the second polyimide layer and the first polyimide layer are the same; the TFT structure and the OLED structure may be manufactured in accordance with a normal process in the field, and the present invention does not make particular limitations.

In one embodiment of the present invention, in S30, the specific step of applying a laser lift-off process to separate the rigid substrate and the first polyimide layer is: illuminating a 343 nm laser onto the rigid substrate, such that a portion of the first polyimide layer near to the rigid substrate is melted, thereby realizing the first polyimide layer and the rigid substrate through a laser lift-off process, so as to obtain a complete first polyimide layer.

It is noted that those skilled in the art can also make changes and modifications to the aforementioned embodiments according to the aforementioned disclosures and descriptions of the specification. Accordingly, the present invention is not limited to the above disclosed and described specific embodiments, and a number of equivalent modifications and changes should also be within the claim scope of the present invention. In addition, although some specific terms are used in the specification, these specific terms are merely for convenience of explanation but do not make any limitations to the present invention.

What is claimed is:

1. A flexible organic light-emitting diode (OLED) display panel, comprising a first polyimide layer, a barrier layer and a second polyimide layer that are sequentially stacked and a thin film transistor (TFT) structure and an OLED structure that are sequentially stacked on the second polyimide layer, an oxygen barrier layer disposed between the second polyimide layer and the TFT structure, wherein the barrier layer comprises a single-layered silicon dioxide layer or a single-layered silicon nitride layer, or comprises alternately stacked silicon dioxide layers and silicon nitride layers, and wherein the TFT structure comprises a first drain electrode and a second drain electrode; an organic film disposed between the TFT structure and the OLED structure, wherein the organic film reserves cavities for the first drain electrode and the second drain electrode to penetrate therethrough; the cavities surround the first drain electrode and the second drain electrode, and wherein the organic film covers a side edge of the TFT structure and in contact with the second polyimide layer and the oxygen barrier layer.

2. The flexible OLED display panel according to claim 1, wherein a thickness of the barrier layer is 0.1-2.0 µm.

3. The flexible OLED display panel according to claim 1, wherein a material of the oxygen barrier layer comprises at least one of silicon dioxide and silicon nitride.

4. The flexible OLED display panel according to claim 1, wherein a material of the organic film comprises one or more of polyethylene, polypropylene, polystyrene, polylactic acid, polyethylene terephthalate, polyimide and polyester.

5. The flexible OLED display panel according to claim 1, wherein a material of each of the first polyimide layer and the second polyimide layer is polyimide resin or modified polyimide resin.

6. The flexible OLED display panel according to claim 1, wherein a thickness of each of the first polyimide layer and the second polyimide layer is 3-20 µm.

7. The flexible OLED display panel according to claim 3, wherein a material of the organic film comprises one or more of polyethylene, polypropylene, polystyrene, polylactic acid, polyethylene terephthalate, polyimide and polyester.

* * * * *